(12) United States Patent
Ban et al.

(10) Patent No.: US 6,578,359 B2
(45) Date of Patent: Jun. 17, 2003

(54) STIRLING ENGINE

(75) Inventors: Masaki Ban, Saitama (JP); Masahiro Asai, Saitama (JP)

(73) Assignee: Honda Giken Kogyo Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/094,813

(22) Filed: Mar. 12, 2002

(65) Prior Publication Data

US 2002/0124561 A1 Sep. 12, 2002

(30) Foreign Application Priority Data

Mar. 12, 2001 (JP) ........................................ 2001-069228

(51) Int. Cl.$^7$ .............................................. F01B 29/10
(52) U.S. Cl. .............................. 60/523; 60/524; 60/526
(58) Field of Search .......................... 60/517, 523, 524, 60/526

(56) References Cited

U.S. PATENT DOCUMENTS

| | | | | |
|---|---|---|---|---|
| 4,602,174 A | * | 7/1986 | Redlich ...................... | 290/1 R |
| 4,761,960 A | * | 8/1988 | Higham et al. ............... | 310/12 |
| 4,944,270 A | * | 7/1990 | Matsushita et al. .......... | 29/602.1 |
| 5,180,939 A | * | 1/1993 | Rosswurm ................... | 290/1 R |
| 6,199,381 B1 | * | 3/2001 | Unger et al. .................. | 60/520 |

* cited by examiner

*Primary Examiner*—Hoang Nguyen
(74) *Attorney, Agent, or Firm*—Birch, Stewart, Kolasch & Birch, LLP

(57) ABSTRACT

To generate electric power efficiently with a thermoelectromagnetic generator using the heat regenerator of a Stirling engine. When a high-temperature operating gas and a low-temperature operating gas alternately pass through a heat regenerator of a Stirling engine, the temperature of the heat regenerator increases and decreases periodically. A thermo-electromagnetic generator G integrally associated with the heat regenerator has a yoke making up a closed magnetic circuit passing through the heat regenerator, a permanent magnet for supplying magnetic fluxes to the magnetic circuit, and an induction coil responsive to changes in the magnetic fluxes of the magnetic circuit. The heat regenerator which is made of a ferromagnetic material has a Curie temperature which is present in a range of varying temperatures of the heat regenerator. When the temperature of the heat regenerator periodically changes across the Curie temperature, the magnetic fluxes passing through the induction coil are varied greatly each time the temperature of the heat regenerator passes through the Curie temperature, generating a large electromotive force across the induction coil.

18 Claims, 12 Drawing Sheets

RANGE OF VARYING TEMPERATURES

STIRLING ENGINE

CROSS-REFERENCE TO RELATED APPLICATIONS

The present application claims priority under 35 USC 119 to Japanese Patent Application No. 2001-069228 filed on Mar. 12, 2001.

BACKGROUND OF THE INVENTION

1. Field of the Invention

The present invention relates to a Stirling engine having a thermoelectromagnetic generator associated with a heat regenerator for storing and radiating the heat of an operating gas which flows between an expansion chamber and a compression chamber.

2. Description of Background Art

Transactions (B) of the Japan Society of Mechanical Engineers, Vol. 62, No. 595, entitled "Increasing the Performance of a Semi-Free-Piston Stirling Engine Regenerator with a Compound Mesh Matrix" describes increasing the performance of a heat regenerator to improve the thermal efficiency of a Stirling engine by using a laminated assembly of metal screens of different meshes, instead of a laminated assembly of metal screens of the same mesh which has heretofore been used in general, as a Stirling engine heat regenerator.

Since the operating gas flows back and forth through small passages provided by the metal meshes of the heat regenerator, the resistance presented to the flow of the operating gas by the metal meshes lowers the overall thermal efficiency of the Stirling engine. In view of the fact that the temperature of the heat regenerator periodically increases and decreases, it is proposed to combine a thermoelectromagnetic generator with the heat regenerator to generate electric power to compensate for the energy loss caused by the resistance presented to the flow of the operating gas.

SUMMARY AND OBJECTS OF THE INVENTION

The present invention has been made in view of the above drawbacks. It is an object of the present invention to generate electric power efficiently with a thermoelectromagnetic generator using the heat regenerator of a Stirling engine.

To achieve the above object, there is proposed according to the present invention a Stirling engine including a communication path interconnecting an expansion chamber heated by a heating unit and a compression chamber cooled by a cooling unit. A heat regenerator is disposed in the communication path for storing and radiating the heat of an operating gas which flows between the expansion chamber and the compression chamber. A thermoelectromagnetic generator is associated with the heat regenerator wherein the thermoelectromagnetic generator has a yoke providing a closed magnetic circuit passing through the heat regenerator, magnetomotive force means for supplying magnetic fluxes to the magnetic circuit, and an induction coil responsive to a change in the magnetic fluxes in the magnetic circuit. The heat regenerator is made of a ferromagnetic material and has a Curie temperature which is present in a range of varying temperatures of the heat regenerator.

With the above arrangement, since the temperature of the heat regenerator which is made of a ferromagnetic material varies periodically across the Curie temperature, the magnetic fluxes passing through the induction coil are varied greatly each time the temperature of the heat regenerator passes through the Curie temperature, generating a large electromotive force across the induction coil. Since the thermoelectromagnetic generator associated with the heat regenerator is capable of generating electric power efficiently, an energy loss caused by the resistance to the flow of the operating gas as it passes through the heat regenerator is compensated for thus increasing the overall thermal efficiency of the Stirling engine.

According to the present invention, the heat regenerator includes a plurality of segments divided in the direction in which the operating gas flows, the segments having respective Curie temperatures progressively lower from a side of the heat regenerator near the expansion chamber toward a side of the heat regenerator near the compression chamber.

With the above arrangement, because the heat regenerator is divided into a plurality of segments, and the Curie temperatures of the respective segments are progressively lower from the side of the heat regenerator near the expansion chamber towards the side of the heat regenerator near the compression chamber. Even if the temperature distribution of the heat regenerator is progressively lower from the side of the heating unit to the side of the cooling unit, the temperature of the entire area of the heat regenerator increases and decreases across the Curie temperature, allowing the thermoelectromagnetic generator to generate electric power efficiently.

Permanent magnets 32 in the embodiment correspond to the magnetomotive force means according to the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Aspects of the present invention will hereinafter be described based on embodiments shown in the accompanying drawings.

Figure 1:
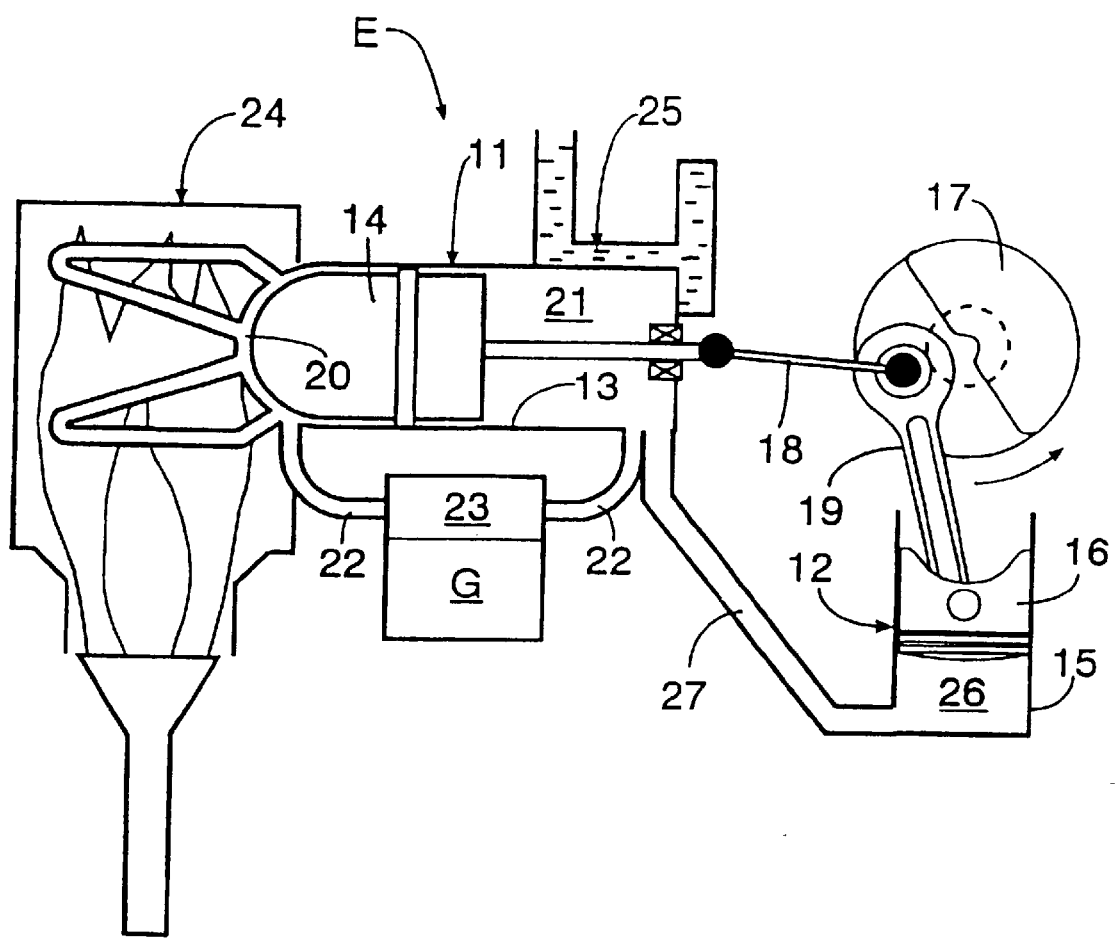
FIG. 1 is a view illustrative of an overall structure of a γ-type Stirling engine according to a first embodiment.

As shown in FIG. 1, a γ-type Stirling engine E has a displacer device 11 and a power cylinder device 12 having respective cylinder axes crossing each other. A displacer piston 14 slidably fitted in a displacer cylinder 13 and a power piston 16 slidably fitted in a power cylinder 15 are connected to a common crankshaft 17 by respective connecting rods 18, 19. The common crankshaft 17 serves as an output shaft. The displacer piston 14 and the power piston 16 are thus reciprocally movable substantially 90° out of phase with each other.

The interior of the displacer cylinder 13 is divided by the displacer piston 14 into an expansion chamber 20 in the head of the displacer cylinder 13 and a compression chamber 21 in the bottom of the displacer cylinder 13. The expansion chamber 20 and the compression chamber 21 are interconnected by a communication passage 22 with a heat regenerator 23 disposed therein. Around the expansion chamber 20, there is disposed a heating unit 24 for heating an operating gas in the expansion chamber 20 with the combustion of a fuel gas. Around the compression chamber 21, there is disposed a cooling unit 25 for cooling the operating gas in the compression chamber 21 with the circulation of cooling water.

When the operating gas is heated to a high temperature in the expansion chamber 20 by the heating unit 24 and moves through the communication passage 22 toward the compression chamber 21 upon movement of the displacer piston 14 to the left in FIG. 1, the heat regenerator 23, which is capable of storing and radiating heat, absorbs heat removed from the operating gas at the high temperature. When the operating gas is cooled to a low temperature in the compression chamber 21 by the cooling unit 25 moves through the communication passage 22 toward the expansion chamber 20 upon movement of the displacer piston 14 to the right in FIG. 1, the heat regenerator 23 radiates the stored heat into the operating gas at the low temperature. Therefore, the temperature of the heat regenerator 23 itself increases when it stores the heat and decreases when it radiates the heat, resulting in temperature changes in the heat regenerator 23 in synchronism with the reciprocating movement of the displacer piston 14.

An operating chamber 26 defined between the power cylinder 15 and power piston 16 of the power cylinder device 12 communicates with the compression chamber 21 of the displacer device 11 via a communication passage 27.

Figure 2:
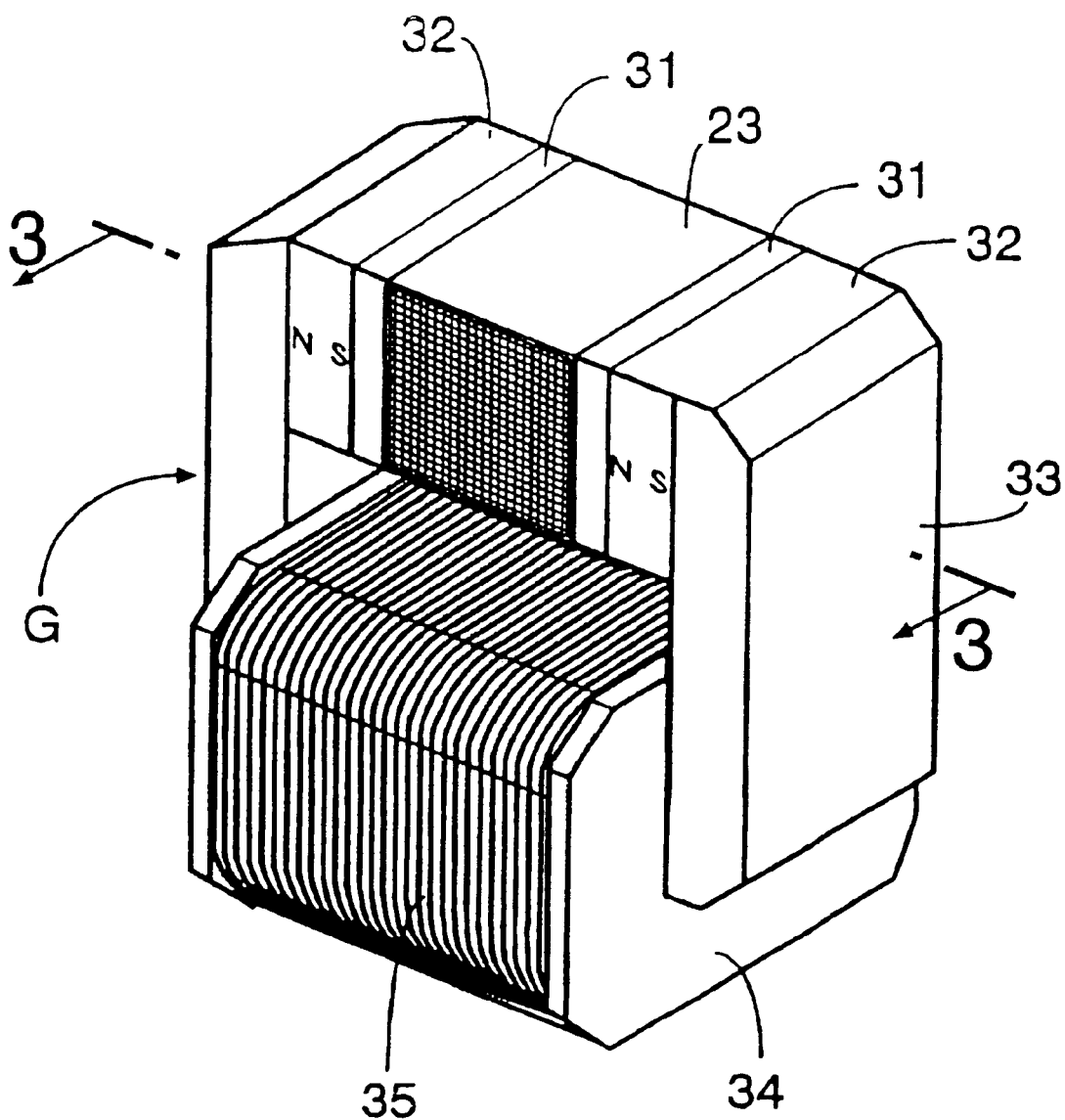
FIG. 2 is a perspective view of a thermoelectromagnetic generator.
Figure 3:
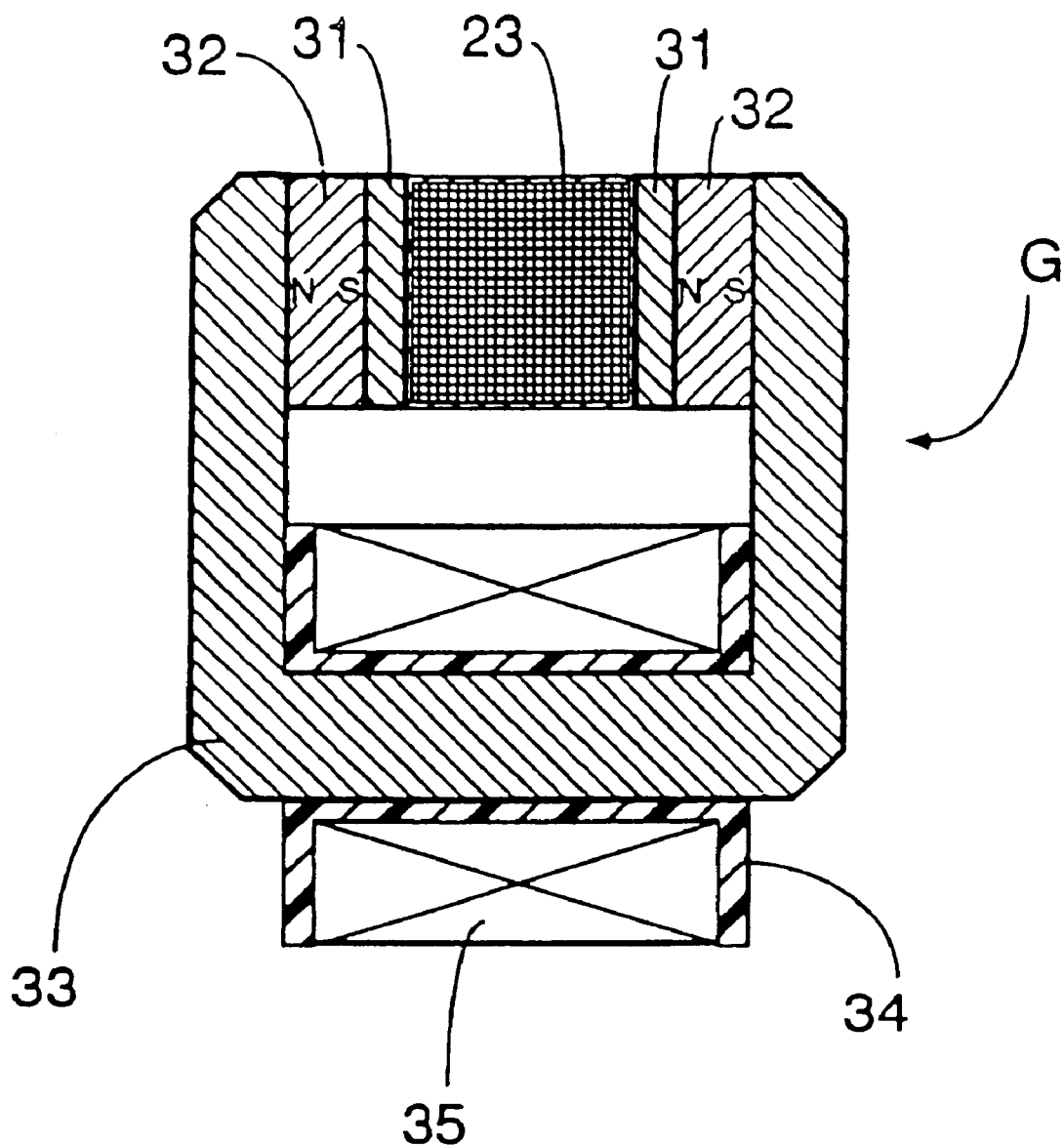
FIG. 3 is a cross-sectional view taken along line 3—3 of FIG. 2.

A structure of a thermoelectromagnetic generator G will be described with reference to FIG. 1 and also FIGS. 2 and 3.

The heat regenerator 23 is made of a ferromagnetic material such as temperature-sensitive ferrite, and has a number of small passages to provide a required surface area for contact with the operating gas. A pair of magnetic poles 31, 31 and a pair of permanent magnets 32, 32 as magnetomotive force means are laminated on opposite sides of the heat regenerator 23. A U-shaped yoke 33 has opposite ends connected to respective sides of the permanent magnets 32, 32. The heat regenerator 23, the magnetic poles 31, 31, the permanent magnets 32, 32, and the yoke 33 jointly make up a closed magnetic circuit. An induction coil 35 responsive to changes in the magnetic fluxes of the magnetic circuit is disposed around a bobbin 34 which is mounted on the portion of the yoke 33 which confronts the heat regenerator 23. The induction coil 35 has turns wound in planes perpendicular to the direction of the magnetic fluxes.

Figure 4:
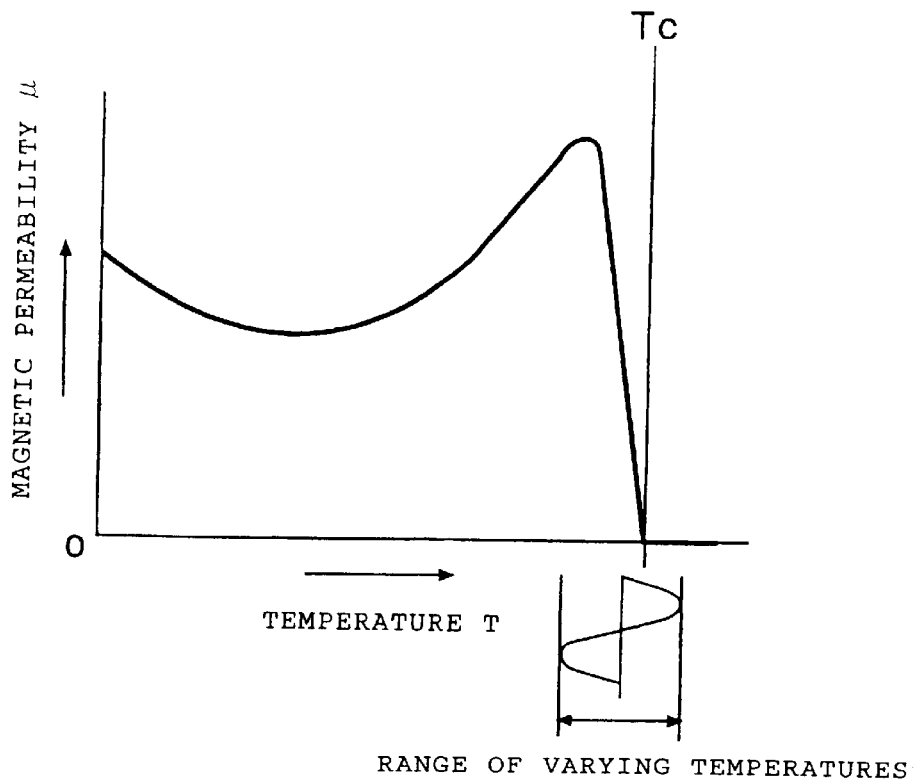
FIG. 4 is a graph showing the relationship between the temperature and magnetic permeability of a heat regenerator.

FIG. 4 shows the characteristics of changes of the magnetic permeability $\mu$ with respect to the temperature T of the heat regenerator 23. The magnetic permeability $\mu$ varies peculiarly across a Curie temperature Tc. Specifically, in a temperature range below the Curie temperature Tc, the magnetic permeability decreases, then increases, and decreases again while maintaining positive values as the temperature of the heat regenerator 23 rises. In a temperature range equal to or higher than the Curie temperature Tc, however, the magnetic permeability $\mu$ becomes nil. The Curie temperature Tc is located in a range of varying temperatures of the heat regenerator 23 (a range between the maximum and minimum temperatures thereof).

Operation of the present embodiment arranged as described above will be described below.

First, operation of the γ-type Stirling engine E will be described below with reference to FIG. 1. The expansion chamber 20 of the displacer device 11 is heated by the heating unit 24, and the compression chamber 21 of the displacer device 11 is cooled by the cooling unit 25. The displacer piston 14 is then moved to the left in FIG. 1, and the heat of the high-temperature operating gas pushed out of the expansion chamber 20 is absorbed by the heat regenerator 23, whereupon the pressure in the space (the expansion chamber 20, the compression chamber 21, the communication passage 22, and the heat regenerator 23) where the operating gas is present and low in temperature is lowered. When the displacer piston 14 is moved to the right in FIG. 1, the low-temperature operating gas is pushed out of the compression chamber 21, and the heat absorbed by the heat regenerator 23 is radiated into the low-temperature operating gas. The operating gas now becomes high in temperature, and the pressure in the space where the operating gas is present increases.

Therefore, if the power piston 16 which faces the operating chamber 26 of the power cylinder device 12 that communicates with the above-described space via the communication passage 27 is set to such a phase that the power piston 16 is in a compression stroke when the pressure of the operating gas is low and the power piston 16 is in an expansion stroke when the pressure of the operating gas is high, i.e., if the displacer piston 14 and the power piston 16 are substantially 90° out of phase with each other, then it is possible to extract mechanical energy from the crankshaft 17 connected to the power piston 16.

While the Stirling engine E is thus operating, the high-temperature operating gas and the low-temperature operating gas alternately pass through the heat regenerator 23 upon reciprocating movement of the displacer piston 14 to cause the temperature of the heat regenerator 23 to increase and decrease periodically, and, as a result, the thermoelectromagnetic generator G generates an induced electromotive force.

Figure 5:
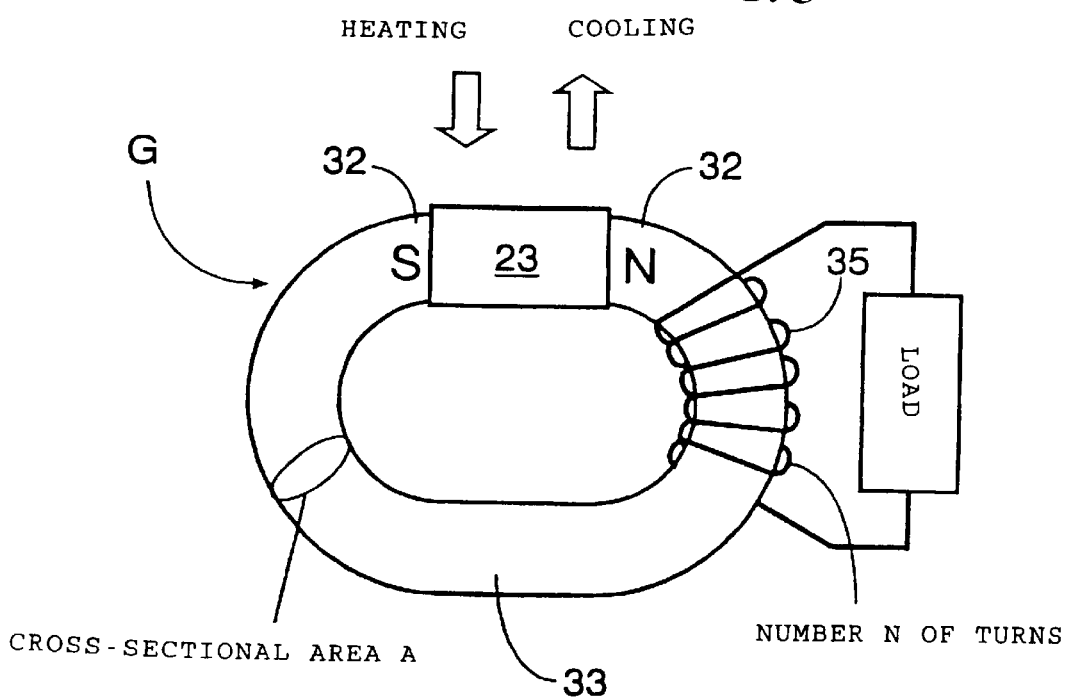
FIG. 5 is a schematic view of the thermoelectromagnetic generator.
Figure 6:
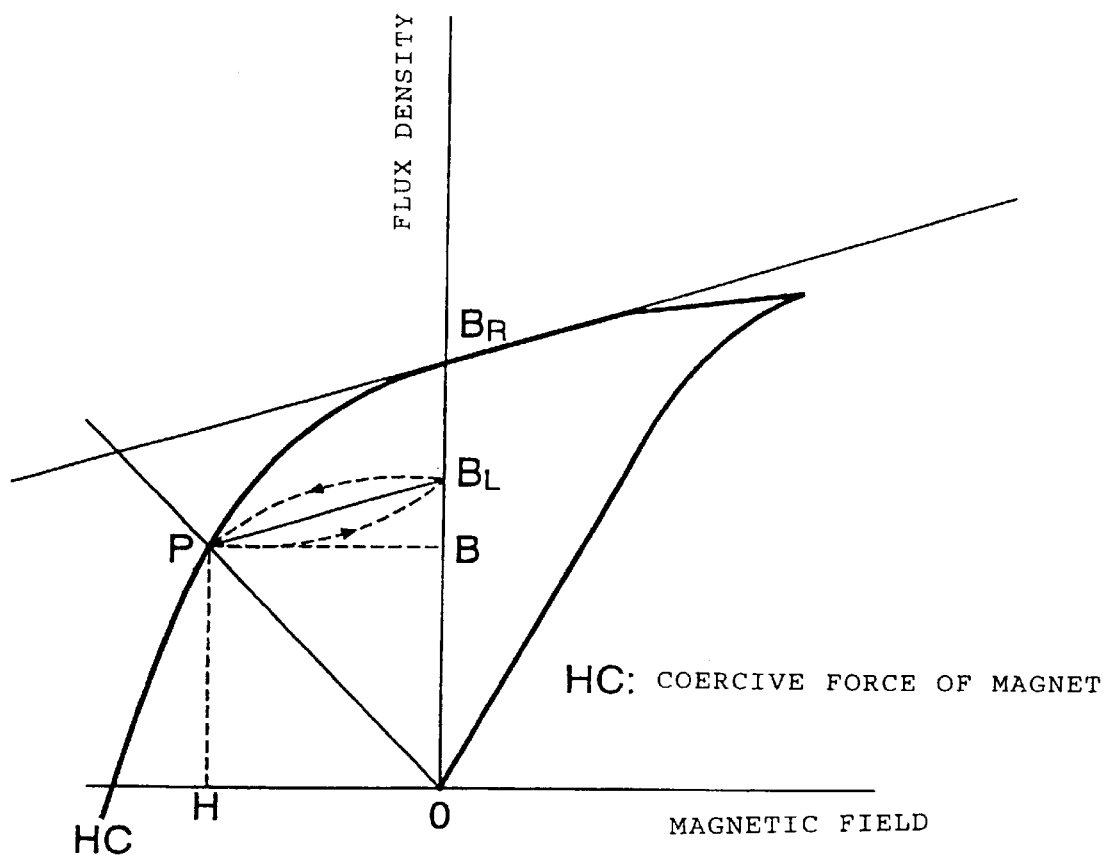
FIG. 6 is a graph showing the relationship between the magnetic field and flux density of the thermoelectromagnetic generator.

As is apparent from FIG. 5, which schematically shows the thermoelectromagnetic generator G, and FIG. 6, which shows the relationship between the magnetic field and the flux density, the flux density of the magnetic circuit is represented by BR when the magnetic fields of the permanent magnets 32, 32 of the thermoelectromagnetic generator G are nil. When the heat regenerator 23 is heated to a temperature equal to or higher than the Curie temperature Tc, since the magnetic permeability $\mu$ of the heat regenerator 23 becomes nil, the heat regenerator 23 becomes equivalent to an air gap. The air gap applies a demagnetized field H (magnetic resistance), moving the operating point to P, reducing the flux density to B. If the yoke 33 has a cross-sectional area A, then the magnetic fluxes ø of the magnetic circuit is represented by ø=B*A. Therefore, when the temperature of the heat regenerator 23 is lower than the Curie temperature Tc, the magnetic fluxes $ø_0$ of the magnetic circuit is represented by $ø_0=B_R*A$, and when the temperature of the heat regenerator 23 is equal to or higher than the Curie temperature Tc, the magnetic fluxes $ø_0$ of the magnetic circuit is represented by $ø_1=B_L*A$, Thus, the magnetic fluxes ø of the magnetic circuit rapidly vary between $ø_0$ and $ø_1$. As a result, when the temperature T of the heat regenerator 23 varies across the Curie temperature Tc, the rate dø/dt of time-dependent change of the magnetic fluxes ø of the magnetic circuit has a large value, making it possible to generate an induced electromotive force V=−N(dø/dt) where N represents the number of turns of the induction coil 35.

When the high-temperature operating gas and the low-temperature operating gas alternately pass through the heat regenerator 23, the thermoelectromagnetic generator G thus generates electric power which makes up for a loss caused by the resistance to the flow of the operating gas through the heat regenerator 23. As the frequency of reciprocating movement of the displacer piston 14 increases, the loss caused by the resistance to the flow of the operating gas through the heat regenerator 23 also increases. Since the rate dø/dt of time-dependent change of the magnetic fluxes ø increases, however, the amount of generated electric power also increases. When the frequency of reciprocating movement of the displacer piston 14 increases, since the temperature amplitude of the heat regenerator 23 is reduced, a lowering of the thermal strain of the heat regenerator 23 results with an increase in the service life of the heat regenerator 23. Because the amount of heat stored by the heat regenerator 23 is reduced, however, it is necessary to use a higher-performance heat storage material for the heat regenerator 23.

A second embodiment of the present invention will be described below with reference to FIGS. 7, 8(A) and 8(B).

Figure 8A:
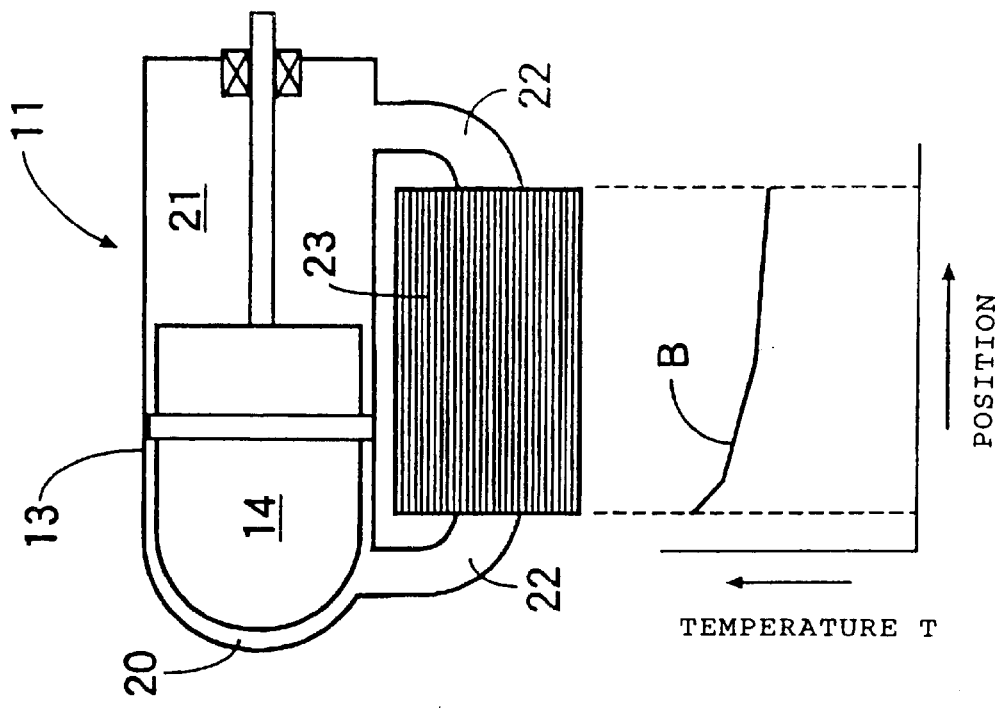
FIGS. 8(A) and 8(B) are views showing temperature distributions of a heat regenerator.

According to the second embodiment, the heat regenerator 23 is divided into a plurality of (three in the embodiment) segments 23a through 23c for increasing an electromotive force generated by the thermoelectromagnetic generator G FIG. 8(A) shows a state where the volume of the compression chamber 21 is reduced by the displacer piston 14, and the heat regenerator 23 radiates heat and is lowered in temperature. FIG. 8(B) shows a state where the volume of the expansion chamber 20 is reduced by the displacer piston 14, and the heat regenerator 23 absorbs heat and is increased in temperature. In either one of the states shown in FIGS. 8(A) and 8(B), the temperature distribution of the heat regenerator 23 is not uniform, but the side of the heat regenerator 23 which communicates with the expansion chamber 20 is higher in temperature, and the side of the heat regenerator 23 which communicates with the compression chamber 21 is lower in temperature.

Figure 7:
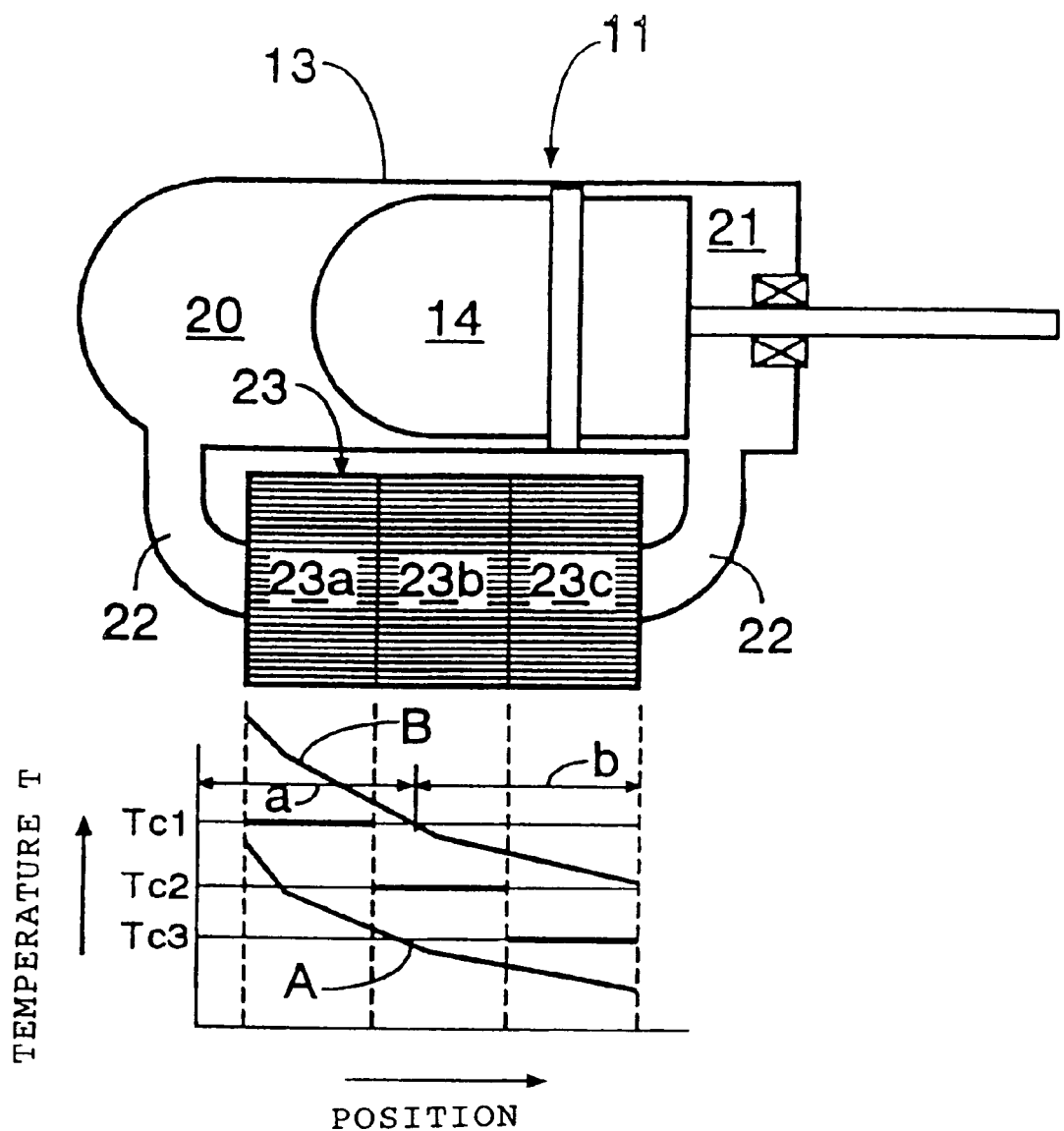
FIG. 7 is a view showing an essential portion of a Stirling engine according to a second embodiment.
Figure 8B:
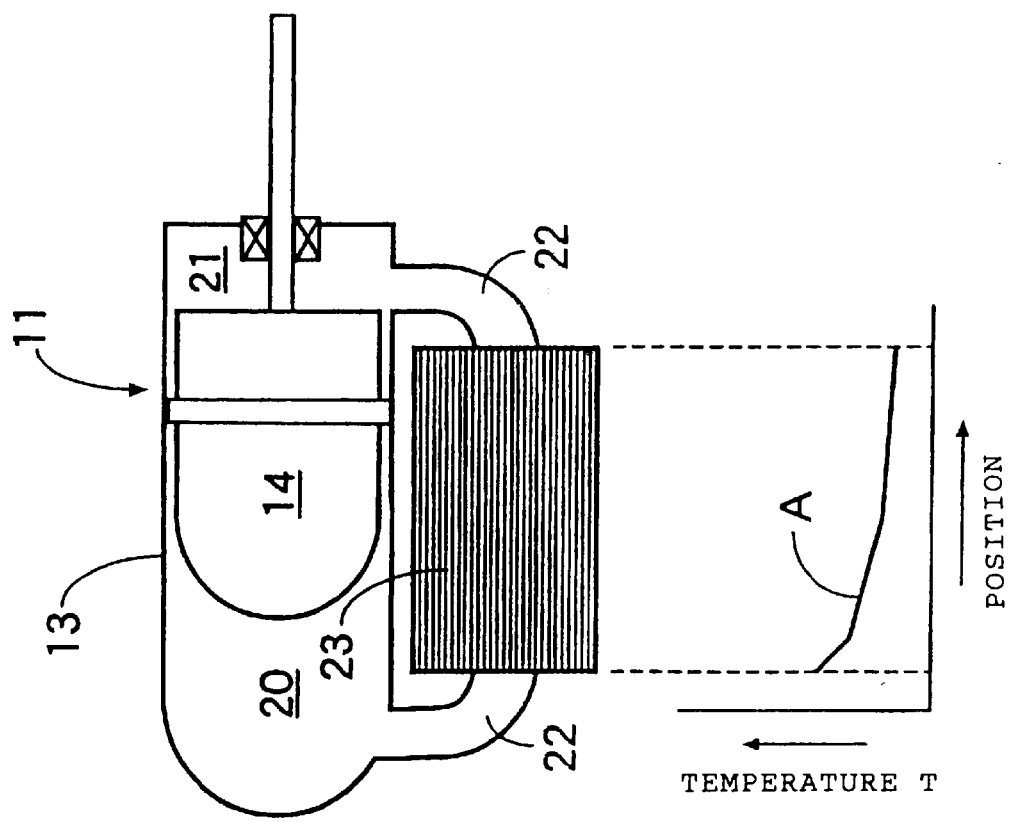

In the graph shown in FIG. 7, the lower curve A represents a temperature distribution when the heat regenerator 23 radiates heat, and the upper curve B represents a temperature distribution when the heat regenerator 23 stores heat. If it is assumed that the heat regenerator 23 has a single Curie temperature Tc1 in its entirety, then the area a of the heat regenerator 23 can have its temperature changed across the Curie temperature Tc1, but the area b of the heat regenerator 23 cannot have its temperature changed across the Curie temperature Tc1, failing to sufficiently perform the generating capability of the thermoelectromagnetic generator G.

According to the present embodiment, the heat regenerator 23 is divided into the three segments 23a through 23c, for example, which are made of such materials that they have different Curie temperatures Tc1 through Tc3, respectively. The first segment 23a close to the high-temperature expansion chamber 20 has a highest Curie temperature Tc1, the third segment 23c close to the low-temperature compression chamber 21 has a lowest Curie temperature Tc3, and the central second segment 23b whose temperature is intermediate has an intermediate Curie temperature Tc2.

When the temperature of the first segment 23a changes between the curves A, B, it changes across the Curie temperature Tc1 in its full range. When the temperature of the second segment 23b changes between the curves A, B, it changes across the Curie temperature Tc2 in its full range. When the temperature of the third segment 23c changes between the curves A, B, it changes across the Curie temperature Tc3 in its full range. Therefore, the heat regenerator 23 can effectively be utilized in its entirety, increasing the electromotive force generated by the thermoelectromagnetic generator G A third embodiment of the present invention will be described below with reference to FIGS. 9 through 11.

According to the third embodiment, a thermoelectromagnetic generator G is associated with a heat regenerator 23 of an α-type Stirling engine E.

Figure 9:
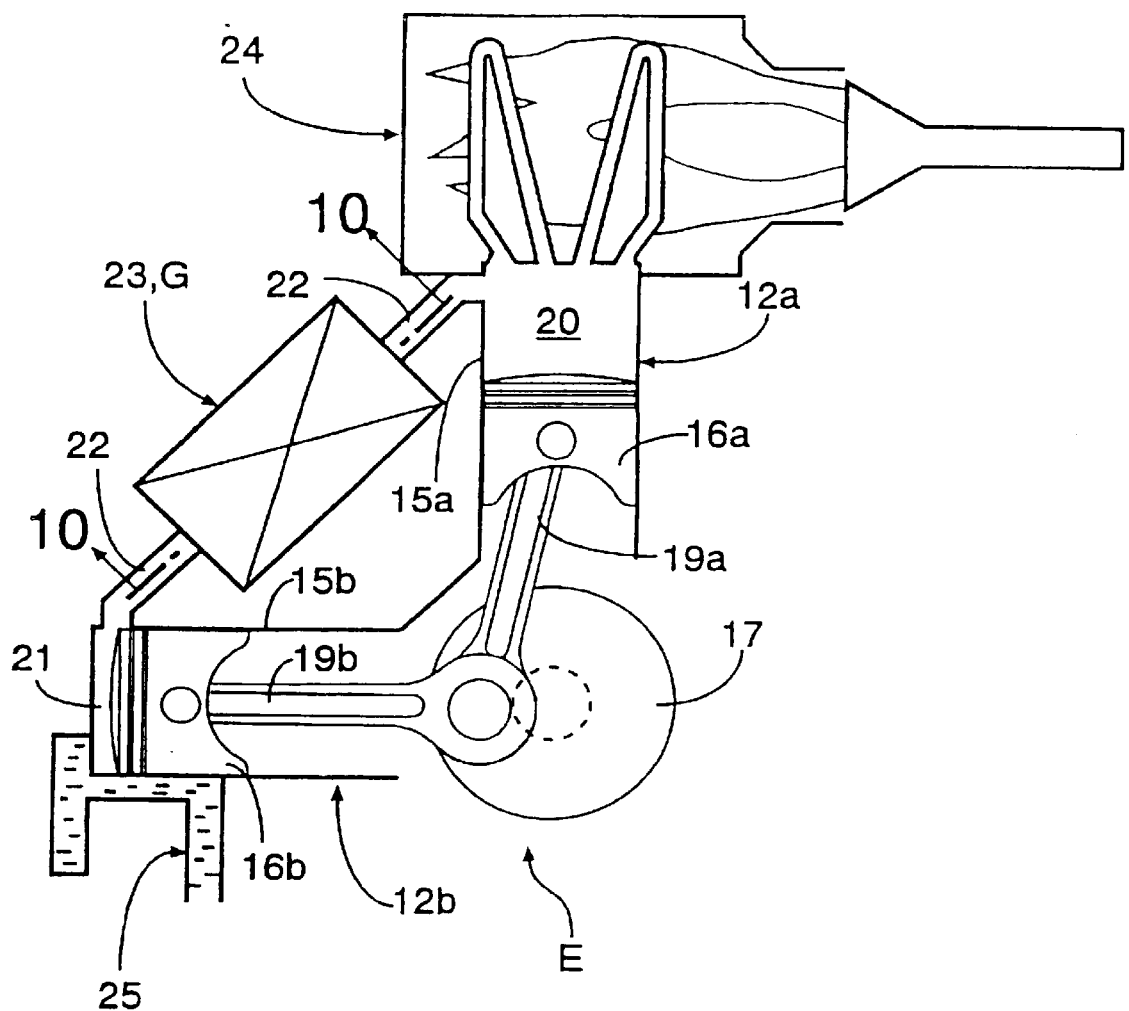
FIG. 9 a view illustrative of an overall structure of a α-type Stirling engine according to a third embodiment.

As shown in FIG. 9, the α-type Stirling engine E has a pair of power cylinder devices 12a, 12b angularly spaced from each other by a substantially right angle. The power cylinder devices 12a, 12b have respective power cylinders 15a, 15b, respective power pistons 16a, 16b slidably fitted therein, a common crankshaft 17, respective connecting rods 19a, 19b connecting the common crankshaft 17 to the power pistons 16a, 16b. An expansion chamber 20 faces the top face of the power piston 16a. A compression chamber 21 faces the top face of the power piston 16b. A heat regenerator 23 is capable of storing and radiating heat with a communication passage 22 connecting the heat regenerator 23 to the expansion chamber 20 and the compression chamber 21. A heating unit 24 is provided for heating the expansion chamber 20. A cooling unit 25 is provided for cooling the compression chamber 21.

Figure 10:
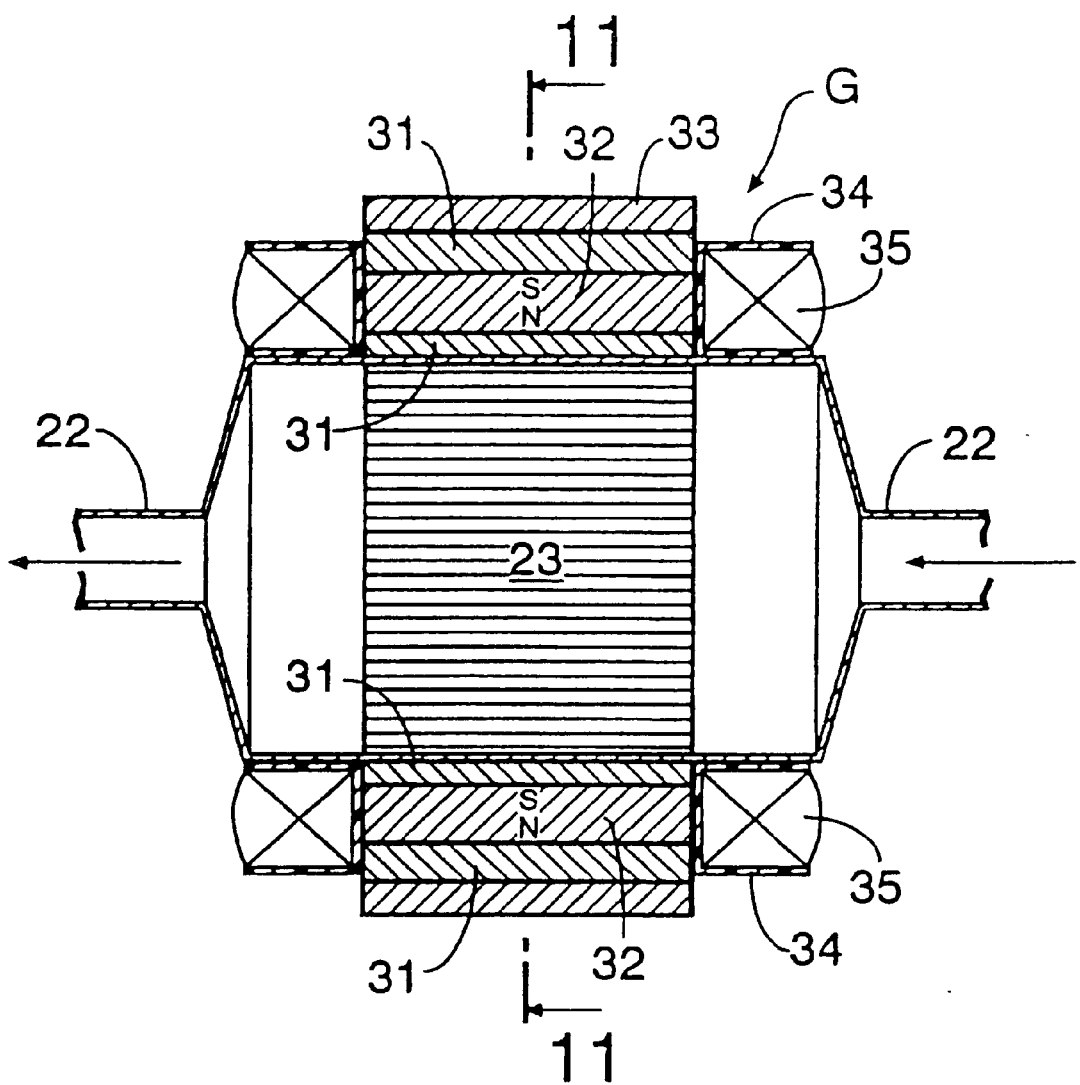
FIG. 10 is a cross-sectional view taken along line 10—10 of FIG. 9.
Figure 11:
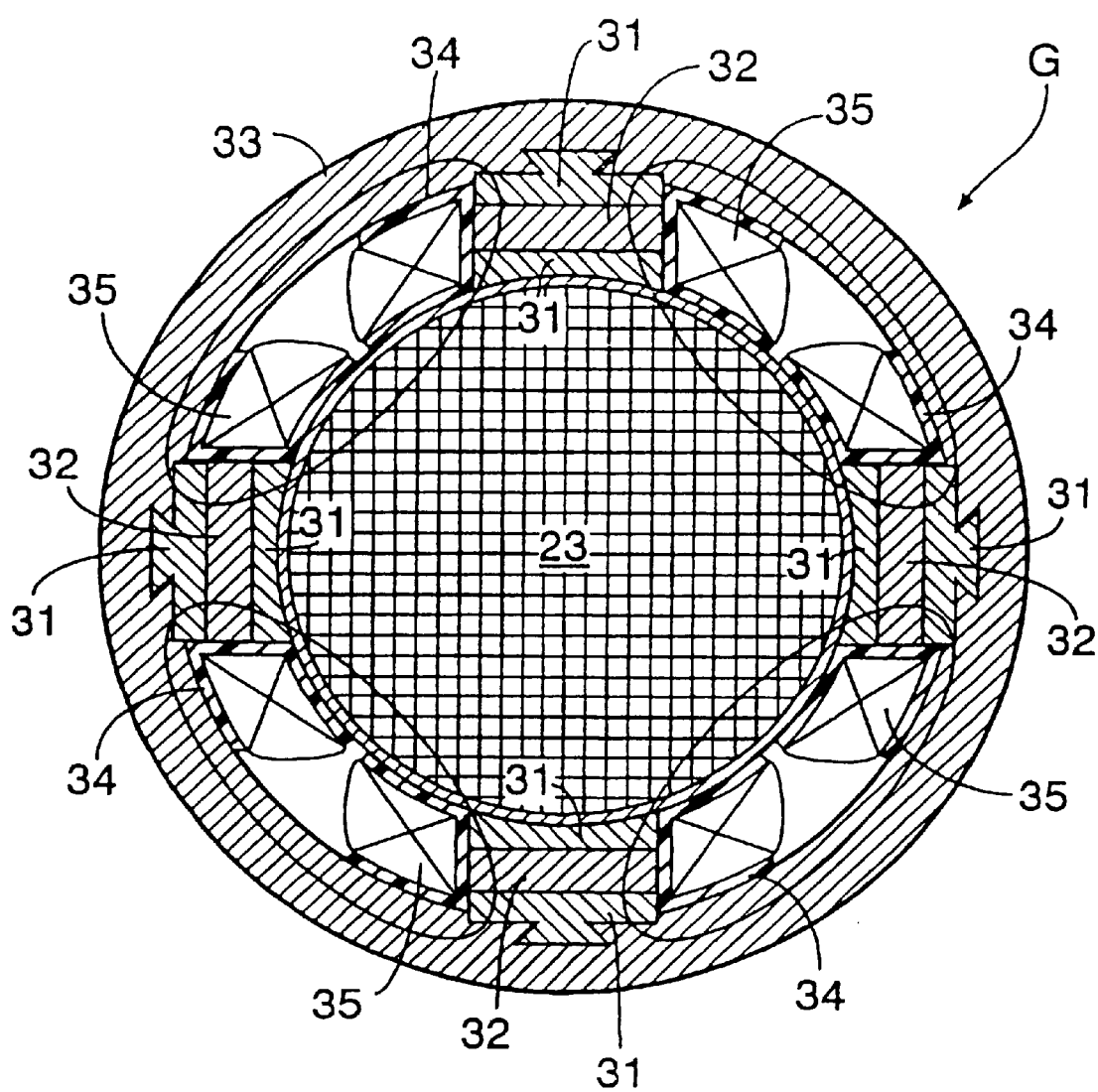
FIG. 11 is a cross-sectional view taken along line 11—11 of FIG. 10.

In FIGS. 10 and 11, the thermoelectromagnetic generator G which is associated with the heat regenerator 23 that is of a cylindrical shape has four assemblies of a pair of magnetic poles 31, 31 and a permanent magnet 32 sandwiched therebetween. The four assemblies are fixedly mounted on the outer circumferential surface of the heat regenerator 23 at angularly spaced intervals of 90°. The thermoelectromagnetic generator G also has a cylindrical yoke 33 and is positioned radially outwardly of and fixed to the four assemblies. Induction coils 35 are wound around bobbins 34 around the respective permanent magnets 32. The induction coils 35 have turns wound in planes perpendicular to the direction of the magnetic fluxes.

In the third embodiment, when the Stirling engine E is in operation, the high-temperature operating gas and the low-temperature operating gas alternately pass through the heat regenerator 23, causing the temperature of the heat regenerator 23 to increase and decrease periodically across the Curie temperature Tc, so that the thermoelectromagnetic generator G generates electromotive forces induced across the four induction coils 35 . . . , thus generating electric power. The present embodiment offers the same advantages as the first embodiment, and also allows the thermoelectromagnetic generator G to be reduced in size and generate a large electric power because of the four induction coils 35 . . . disposed around the heat regenerator 23.

Figure 12:
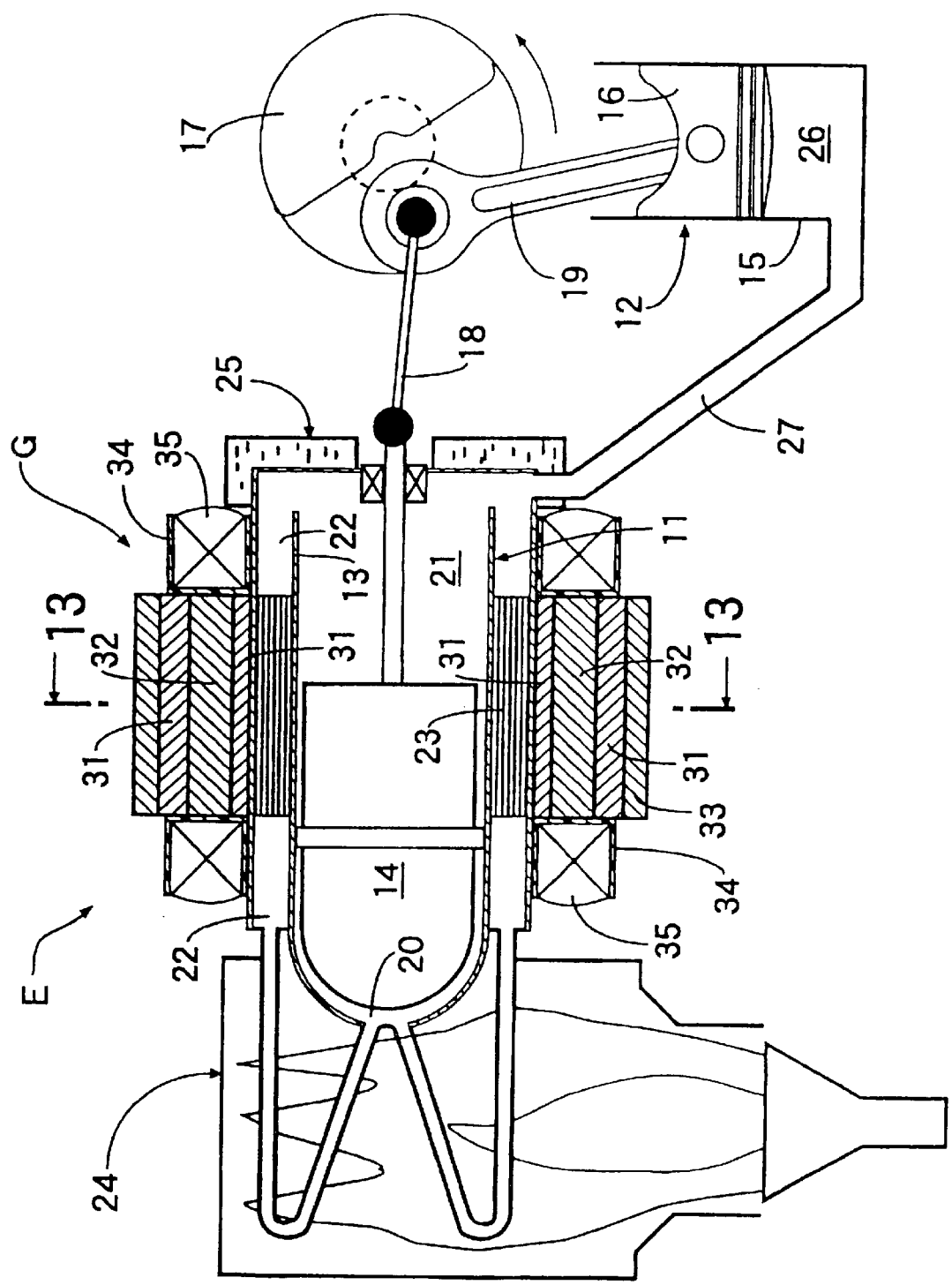
FIG. 12 is a view illustrative of an overall structure of a γ-type Stirling engine according to a fourth embodiment.
Figure 13:
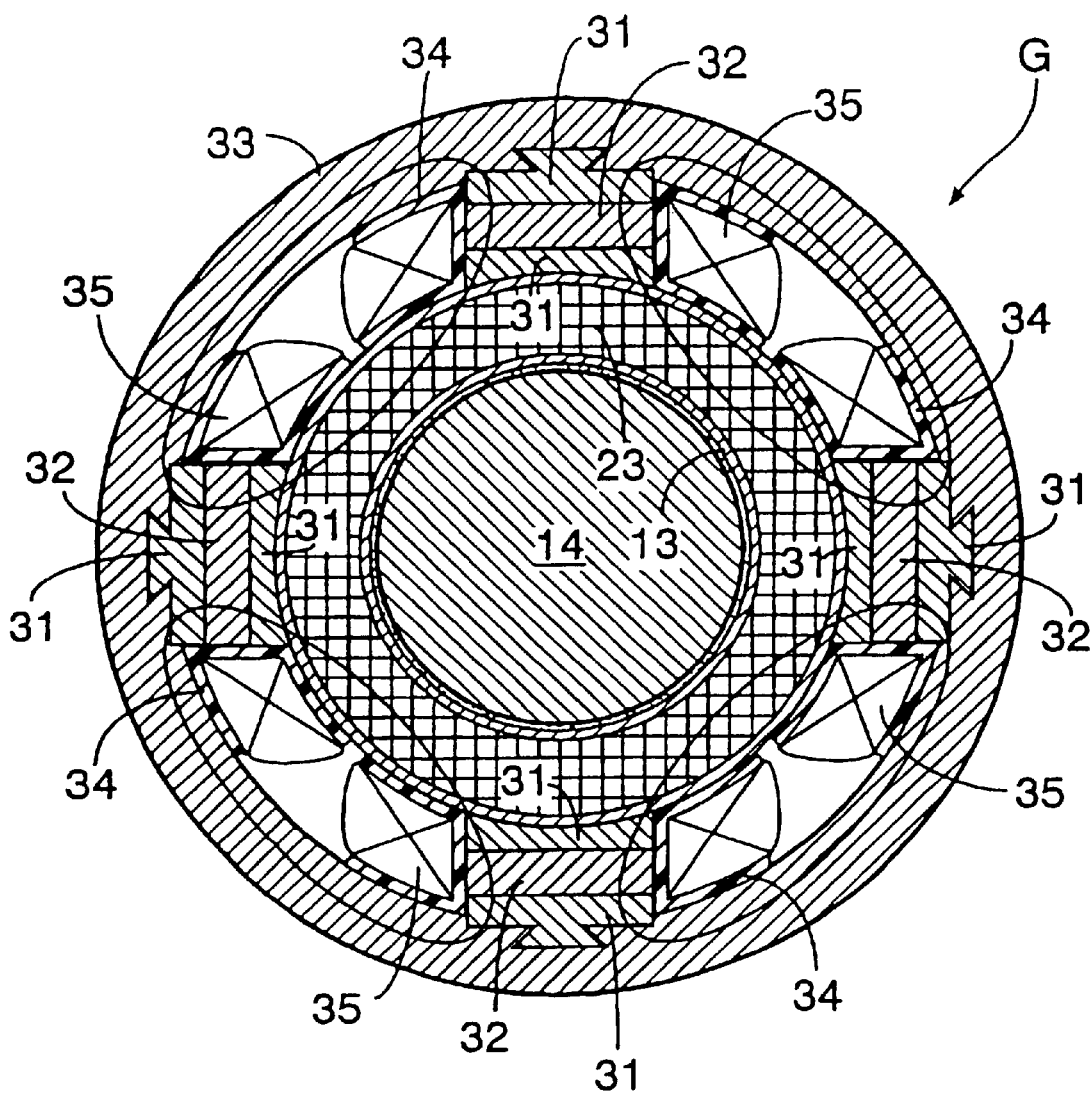
FIG. 13 is a cross-sectional view taken along line 13—13 of FIG. 12.

A fourth embodiment of the present invention will be described below with reference to FIGS. 12 and 13.

According to the fourth embodiment, a heat regenerator 23 of a γ-type Stirling engine E, which is the same as the Stirling engine according to the first embodiment, is constructed as an annular shape disposed around a displacer cylinder 13. In addition, an annular thermoelectromagnetic generator G, which is of the same structure as the third embodiment, is disposed around the annular heat regenerator 23. The present embodiment offers the same advantages as those of the third embodiment in addition to the advantages of the first embodiment.

While the embodiments of the present invention have been described in detail above, various design changes and modifications may be made to the embodiments without departing from the scope of the present invention.

For example, the γ-type Stirling engine E and the α-type Stirling engine E have been described in the embodiments. However, the present invention is also applicable to a β-type Stirling engine.

The Stirling engine E is not limited to an engine which extracts the output power from the crankshaft 17, but may be an actuator for extracting the input power to the displacer piston 14 as the output power from the power piston 16.

In the embodiments, the heating unit 24 for making flame combustion of the fuel has been illustrated. However, the heating unit 24 may be of the type which makes catalytic combustion. The coolant used by the cooling unit 25 is not restricted to cooling water.

According the present invention, as described above, since the temperature of the heat regenerator which is made of a ferromagnetic material varies periodically across the Curie temperature, the magnetic fluxes passing through the induction coil are varied greatly each time the temperature of the heat regenerator passes through the Curie temperature, generating a large electromotive force across the induction coil. Since the thermoelectromagnetic generator associated with the heat regenerator is capable of generating electric power efficiently, an energy loss caused by the resistance to the flow of the operating gas as it passes through the heat regenerator is compensated for, increasing the overall thermal efficiency of the Stirling engine.

According the present invention, because the heat regenerator is divided into a plurality of segments, and the Curie temperatures of the respective segments are progressively lower from the side of the heat regenerator near the expansion chamber toward the side of the heat regenerator near the compression chamber, even if the temperature distribution of the heat regenerator is progressively lower from the side of the heating unit to the side of the cooling unit, the temperature of the entire area of the heat regenerator increases and decreases across the Curie temperature, allowing the thermoelectromagnetic generator to generate electric power efficiently.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A Stirling engine comprising:
   a communication path interconnecting an expansion chamber heated by a heating unit and a compression chamber cooled by a cooling unit;
   a heat regenerator disposed in the communication path for storing and radiating heat of an operating gas which flows between the expansion chamber and the compression chamber; and
   a thermoelectromagnetic generator (G) associated with the heat regenerator,
   wherein said thermoelectromagnetic generator (G) includes a yoke providing a closed magnetic circuit passing through the heat regenerator, magnetomotive force means for supplying magnetic flux to the magnetic circuit, and an induction coil responsive to a change in the magnetic flux in the magnetic circuit, and
   the heat regenerator is made of a ferromagnetic material having a Curie temperature (Tc) which is present in a range of varying temperatures of the heat regenerator.

2. The Stirling engine according to claim 1, wherein the heat regenerator includes a plurality of segments divided in the direction in which the operating gas flows, said segments having different Curie temperatures which are progressively lower from a side of the heat regenerator near the expansion chamber toward a side of the heat regenerator near the compression chamber.

3. The Stirling engine according to claim 1, wherein said heat regenerator includes a plurality of passages for providing a predetermined surface area for contact with the operating gas.

4. The Stirling engine according to claim 1, wherein said magnetomotive force means includes a pair of magnetic poles and a pair of permanent magnets positioned on opposite sides of said heat regenerator.

5. The Stirling engine according to claim 4, wherein said yoke is U-shaped for positioning the pair of permanent magnets and the pair of magnetic poles adjacent to the heat regenerator, said heat regenerator, said magnetic poles, said permanent magnets and said U-shaped yoke jointly forming said closed magnetic circuit.

6. The Stirling engine according to claim 5, wherein said induction coil is disposed on said U-shaped yoke adjacent to said heat regenerator, said induction coil including turns wound in planes perpendicular to the direction of the magnetic flux generated from said permanent magnets.

7. The Stirling engine according to claim 1, wherein said heat regenerator is of a cylindrical shape and is disposed around said compression chamber with said communication path being positioned to extend through said heat regenerator.

8. The Stirling engine according to claim 7, wherein said heat regenerator includes four assemblies of pairs of magnetic poles, and permanent magnets disposed around said compression chamber.

9. The Stirling engine according to claim 8, wherein said four assemblies of pairs of magnetic poles, and permanent magnets are disposed at substantially ninety degree angles relative to each other around said compression chamber.

10. A Stirling engine comprising:
- a communication path interconnecting an expansion chamber heated by a heating unit and a compression chamber cooled by a cooling unit;
- a heat regenerator operatively positioned adjacent to the communication path for storing and radiating heat of an operating gas which flows between the expansion chamber and the compression chamber; and
- a thermoelectromagnetic generator (G) associated with the heat regenerator;
- wherein said thermoelectromagnetic generator (G) comprises:
  - a magnet for passing a magnetic flux through the heat regenerator;
  - magnetomotive force means for supplying the magnetic flux to the magnetic, and
  - an induction coil responsive to a change in the magnetic flux in the magnetic, and
- said heat regenerator being made of a ferromagnetic material having a Curie temperature (Tc) in a range of varying temperatures of the heat regenerator.

11. The Stirling engine according to claim 10, wherein the heat regenerator includes a plurality of segments divided in the direction in which the operating gas flows, said segments having different Curie temperatures which are progressively lower from a side of the heat regenerator near the expansion chamber toward a side of the heat regenerator near the compression chamber.

12. The Stirling engine according to claim 10, wherein said heat regenerator includes a plurality of passages for providing a predetermined surface area for contact with the operating gas.

13. The Stirling engine according to claim 10, wherein said magnetomotive force means includes a pair of magnetic poles and a pair of permanent magnets positioned on opposite sides of said heat regenerator.

14. The Stirling engine according to claim 13, and further including a yoke of a U-shaped for positioning the pair of permanent magnets and the pair of magnetic poles adjacent to the heat regenerator, said heat regenerator, said magnetic poles, said permanent magnets and said U-shaped yoke jointly forming a closed magnetic circuit.

15. The Stirling engine according to claim 14, wherein said induction coil is disposed on said U-shaped yoke adjacent to said heat regenerator, said induction coil including turns wound in planes perpendicular to the direction of the magnetic flux generated from said permanent magnets.

16. The Stirling engine according to claim 10, wherein said heat regenerator is of a cylindrical shape and is disposed around said compression chamber with said communication path being positioned to extend through said heat regenerator.

17. The Stirling engine according to claim 16, wherein said heat regenerator includes four assemblies of pairs of magnetic poles, and permanent magnets disposed around said compression chamber.

18. The Stirling engine according to claim 17, wherein said four assemblies of pairs of magnetic poles, and permanent magnets are disposed at substantially ninety degree angles relative to each other around said compression chamber.

* * * * *